US011922992B2

(12) United States Patent
Baek et al.

(10) Patent No.: US 11,922,992 B2
(45) Date of Patent: Mar. 5, 2024

(54) MEMORY DEVICE INCLUDING SUB WORD LINE DRIVING CIRCUIT

(71) Applicant: SAMSUNG ELECTRONICS CO., LTD., Suwon-si (KR)

(72) Inventors: Inseok Baek, Suwon-si (KR); Bokyeon Won, Namyangju-si (KR); Kyoungmin Kim, Namyangju-si (KR); Donggeon Kim, Suwon-si (KR); Myeongsik Ryu, Anyang-si (KR); Sangwook Park, Hwaseong-si (KR); Seokjae Lee, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 17/828,200

(22) Filed: May 31, 2022

(65) Prior Publication Data

US 2022/0406361 A1 Dec. 22, 2022

(30) Foreign Application Priority Data

Jun. 18, 2021 (KR) .......................... 10-2021-0079518

(51) Int. Cl.
*G11C 16/08* (2006.01)
*G11C 11/408* (2006.01)
*G11C 16/10* (2006.01)
*G11C 16/16* (2006.01)

(52) U.S. Cl.
CPC .......... *G11C 11/4085* (2013.01); *G11C 16/08* (2013.01); *G11C 16/10* (2013.01); *G11C 16/16* (2013.01)

(58) Field of Classification Search
CPC .......... G11C 16/08; G11C 16/10; C11C 16/16
USPC ...................................... 365/185.11
See application file for complete search history.

(56) References Cited

U.S. PATENT DOCUMENTS

| 6,181,636 | B1 | 1/2001 | Lee et al. |
| 7,551,513 | B2 | 6/2009 | Yoon et al. |
| 8,228,755 | B2 | 7/2012 | Park et al. |
| 8,363,507 | B2 | 1/2013 | Cho |
| 8,953,407 | B2 | 2/2015 | Yun et al. |
| 9,111,633 | B2 | 8/2015 | Kim |
| 9,595,351 | B2 | 3/2017 | Choi |
| 10,910,049 | B2 | 2/2021 | Ingalls et al. |
| 10,957,380 | B2 | 3/2021 | Shin et al. |
| 2012/0213005 | A1* | 8/2012 | Lee ...................... G11C 16/349 365/185.11 |

(Continued)

*Primary Examiner* — Jason Lappas
(74) *Attorney, Agent, or Firm* — Sughrue Mion, PLLC

(57) ABSTRACT

A memory device includes a memory cell array, a row address decoder configured to generate a plurality of main word line driving signals and a plurality of sub word line driving signals, based on an odd signal representing that a main word line driving signal driving an odd word line is activated, generate a plurality of encoded sub word line driving signals used for driving a target word line by outputting the plurality of sub word line driving signals in a first order, and, based on an even signal representing that a main word line driving signal driving an even word line is activated, generate the plurality of encoded sub word line driving signals by outputting the plurality of sub word line driving signals in a second order, and a word line driving circuit configured to drive the target word line at a first voltage level or a second voltage level.

20 Claims, 13 Drawing Sheets

(56) References Cited

U.S. PATENT DOCUMENTS

2015/0003141 A1    1/2015   Son et al.
2019/0189186 A1    6/2019   Won et al.

* cited by examiner

MEMORY DEVICE INCLUDING SUB WORD LINE DRIVING CIRCUIT

CROSS-REFERENCE TO RELATED APPLICATION

This application is based on and claims priority under 35 U. S. C. § 119 to Korean Patent Application No. 10-2021-0079518, filed on Jun. 18, 2021, in the Korean Intellectual Property Office, the disclosure of which is incorporated by reference herein in its entirety.

BACKGROUND

The present disclosure relates to a semiconductor memory device, and more particularly, to a memory device including a sub word line driving signal encoder for reducing wiring complexity of a sub word line driving circuit.

A memory device, for example, dynamic random access memory (DRAM), may include a sub word line driving circuit driving a word line. The sub word line driving circuit includes a plurality of sub word line drivers, and the plurality of sub word line drivers may select a word line based on a sub word line driving signal. As the density of the DRAM increases, the complexity of a routing wiring line transmitting the sub word line driving signal to the plurality of sub word line drivers increases and, as the complexity of the routing wiring line increases, a distance between wiring lines increases.

SUMMARY

One or more example embodiments provide a memory device increasing a routing degree of freedom by generating a sub word line driving signal encoded to vary in accordance with a main word line driving signal and providing the encoded sub word line driving signal to a sub word line driving circuit.

According to an aspect of an example embodiment, there is provided a memory device including a memory cell array including a plurality of memory cells connected to a plurality of word lines; a row address decoder configured to: generate a plurality of main word line driving signals and a plurality of sub word line driving signals based on a row address, based on an odd signal representing that a first main word line driving signal driving an odd word line is activated among the plurality of main word line driving signals being activated, generate a plurality of encoded sub word line driving signals used for driving a target word line among the plurality of word lines by outputting the plurality of sub word line driving signals in a first order, and, based on an even signal representing that a second main word line driving signal driving an even word line is activated among the plurality of main word line driving signals being activated, generate the plurality of encoded sub word line driving signals by outputting the plurality of sub word line driving signals in a second order; and a word line driving circuit configured to drive the target word line at a first voltage level or a second voltage level based on the plurality of main word line driving signals and the plurality of encoded sub word line driving signals.

According to an aspect of an example embodiment, there is provided a memory device including a memory cell array including a plurality of memory cells connected to a plurality of word lines; a row address decoder configured to: generate a plurality of main word line driving signals and a plurality of sub word line driving signals based on a row address, and generate a plurality of encoded sub word line driving signals for driving a target word line among the plurality of word lines by outputting the plurality of sub word line driving signals in different orders in accordance with an odd even signal representing whether an odd main word line or an even main word line is activated; and a word line driving circuit configured to drive the target word line based on the odd even signal and the plurality of encoded sub word line driving signals.

According to an aspect of an example embodiment, there is provided a memory device including a memory cell array including a plurality of memory cells connected to a plurality of sub word lines connected to a plurality of main word lines; a main row decoder configured to generate a plurality of main word line driving signals based on a row address; a sub row decoder configured to generate a plurality of sub word line signals based on the row address; a sub word line driving signal generating circuit configured to generate a plurality of first sub word line driving signals by delaying the plurality of sub word line signals and generate a plurality of second sub word line driving signals by inverting the plurality of sub word line signals; a sub word line driving signal encoder configured to generate a plurality of first encoded sub word line driving signals by outputting the plurality of first sub word line driving signals in different orders or generate a plurality of second encoded sub word line driving signals by outputting the plurality of second sub word line driving signals in different orders based on whether an odd main word line or an even main word line is driven by the plurality of main word line driving signals; and a sub word line driving circuit configured to receive the plurality of main word line driving signals, receive the plurality of first encoded sub word line driving signals or the plurality of second encoded sub word line driving signals, and drive a target word line among the plurality of sub word lines at a first voltage level or a second voltage level.

BRIEF DESCRIPTION OF THE DRAWINGS

The above and other aspects, features, and advantages of certain example embodiments of the present disclosure will be more clearly understood from the following detailed description taken in conjunction with the accompanying drawings in which.

DETAILED DESCRIPTION

Hereinafter, various example embodiments will be described with reference to the accompanying drawings.

Figure 1:
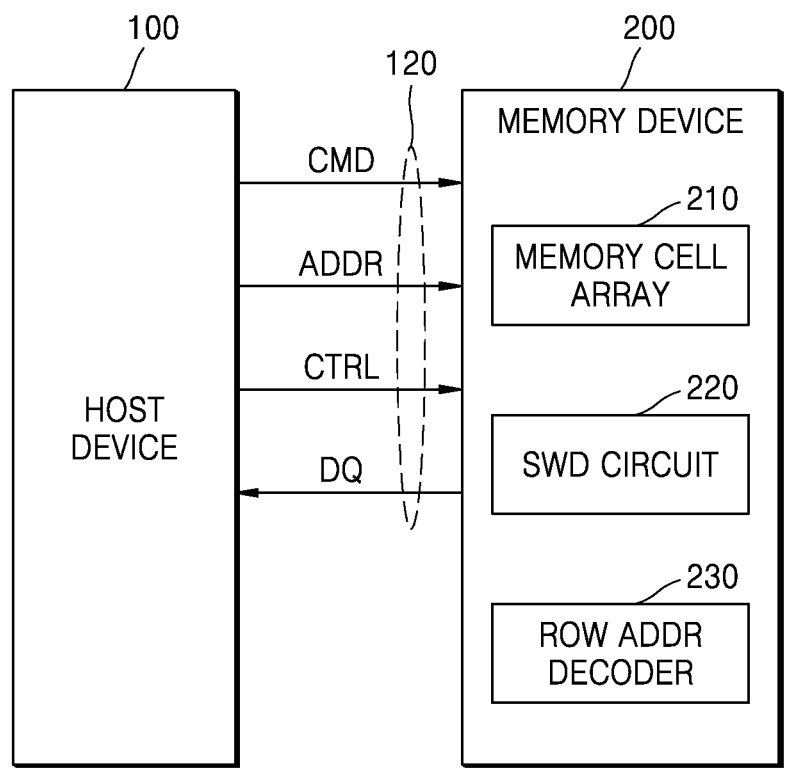
FIG. 1 is a view illustrating a memory system including a memory device according to an example embodiment.

FIG. 1 is a view illustrating a memory system 10 including a memory device 200 according to an example embodiment.

Referring to FIG. 1, the memory system 10 may include a host device 100 and the memory device 200. The host device 100 may be communicatively connected to the memory device 200 through a memory bus 120.

A partial example may be described by using the expressions "connected" and/or "coupled" together with derivatives thereof. The terms are not necessarily intended as synonyms. For example, description given by using the terms "connected" and/or "coupled" may represent that no less than two elements are directly physically or electrically connected to one another. In addition, the terms "connected" and/or "coupled" may represent that the no less than two elements are not directly connected to one another but cooperate with one another or interact.

The host device 100 may include, for example, a computing system such as a computer, a laptop computer, a server, a workstation, a portable communication terminal, a personal digital assistant (PDA), a portable multimedia player (PMP), a smartphone, or a wearable device. Alternatively, the host device 100 may be a part of components included in the computing system such as a graphics card. The host device 100 as a functional block performing a common computer operation in the memory system 10 may correspond to a central processing unit (CPU), a digital signal processor (DSP), a graphics processing unit (GPU), or an application processor (AP).

The memory bus 120 may include signal lines transmitting a command CMD, an address ADDR, and control signals CTRL and data lines transmitting input and output data DQ. For convenience sake, it is illustrated that each of the signal lines and the data lines is connected between the host device 100 and the memory device 200 through one signal line. However, each of the signal lines and the data lines is connected between the host device 100 and the memory device 200 through a plurality of signal lines.

The memory device 200 may write the input and output data DQ or read data in accordance with control of the host device 100. For example, the memory device 200 may include a dynamic random access memory (DRAM) device. However, embodiments are not limited thereto, and the memory device 200 may include one of volatile memory devices such as synchronous DRAM (SDRAM), double data rate SDRAM (DDR SDRAM), low power double data rate SDRAM (LPDDR SDRAM), graphics double data rate SDRAM (GDDR SDRAM), DDR2 SDRAM, DDR3 SDRAM, DDR4 SDRAM, DDR5 SDRAM, Wide I/O DRAM, high bandwidth memory (HBM), and a hybrid memory cube (HMC).

The memory device 200 may include a memory cell array 210, a sub word line driving circuit 220, and a row address decoder 230.

The memory cell array 210 may include a plurality of memory cells connected to a plurality of word lines and a plurality of bit lines arranged in rows and columns.

The sub word line driving circuit 220 may drive a target word line connected to a memory cell selected from the plurality of memory cells included in the memory cell array 210 at a predetermined voltage level. The sub word line driving circuit 220 may drive a word line based on a main word line driving signal MWE and encoded sub word line driving signals EPXID and EPXIB.

The row address decoder 230 may generate the main word line driving signal MWE and the encoded sub word line driving signals EPXID and EPXIB based on a row address ROW_ADDR in the address ADDR. Specifically, the row address decoder 230 may generate a plurality of main word line driving signals MWE[1:N] (N is a natural number of no less than 2) by using K (K is a natural number of no less than 1) first bits among bits configuring the row address ROW_ADDR. N may be 2 to the K squared. The row address decoder 230 may generate a plurality of first and second sub word line driving signals PXID[1:M] and PXIB[1:M] (M is a natural number of no less than 2) by using L (L is a natural number of no less than 1) second bits among the bits configuring the row address ROW_ADDR. M may be 2 to the L squared.

The plurality of second sub word line driving signals PXIB[1:M] may be obtained by inverting the plurality of first sub word line driving signals PXID[1:M]. For example, the second sub word line driving signal PXIB[1] may be obtained by inverting the first sub word line driving signal PXID[1].

The row address decoder 230 may generate a plurality of first and second encoded sub word line driving signals EPXID[1:M] and EPXIB[1:M] by encoding the plurality of first and second sub word line driving signals PXID[1:M] and PXIB[1:M].

The row address decoder 230 may generate the plurality of first and second encoded sub word line driving signals EPXID[1:M] and EPXIB[1:M] by encoding the plurality of first and second sub word line driving signals PXID[1:M] and PXIB[1:M] by different methods based on an odd even signal MWLeo representing whether an activated signal among the plurality of main word line driving signals MWE[1:N] selects an even main word line or an odd main word line. For example, when the odd main word line is selected, the plurality of first encoded sub word line driving signals EPXID[1:M] may be encoded by outputting the plurality of first sub word line driving signals PXID[1:M] in a first order. When the even main word line is selected, the plurality of first encoded sub word line driving signals EPXID[1:M] may be encoded by outputting the plurality of first sub word line driving signals PXID[1:M] in a second order. In example embodiments, the method of encoding the plurality of first encoded sub word line driving signals EPXID[1:M] may be applied to the plurality of second encoded sub word line driving signals EPXIB[1:M].

The sub word line driving circuit 220 may receive the plurality of main word line driving signals MWE[1:N] and the plurality of first and second encoded sub word line driving signals EPXID[1:M] and EPXIB[1:M] and may drive N*M sub word lines. As density increases, the complexity of routing wiring lines for designing the sub word line driving circuit 220 driving the N*M sub word lines may increase. In addition, as the complexity of the routing wiring lines increases, intervals among the routing wiring lines may be reduced.

According to an example embodiment, the plurality of first sub word line driving signals PXID[1:M] are arranged in different orders in accordance with the odd even signal MWLeo so that the plurality of first encoded sub word line driving signals EPXID[1:M] may be encoded. That is, for example, although a conductive wiring line for receiving the first encoded sub word line driving signal EPXID[1] is fixed, the first encoded sub word line driving signal EPXID[1] may be encoded to the first sub word line driving signal varying in accordance with the odd even signal MWLeo (for example, to PXID[2] when an odd signal MWLeo_odd is activated or to PXID[3] when an even signal MWLeo_even is activated). Therefore, because a degree of freedom of routing increases, the complexity of the routing wiring lines may be reduced and the intervals among the routing wiring lines may increase.

Figure 2:
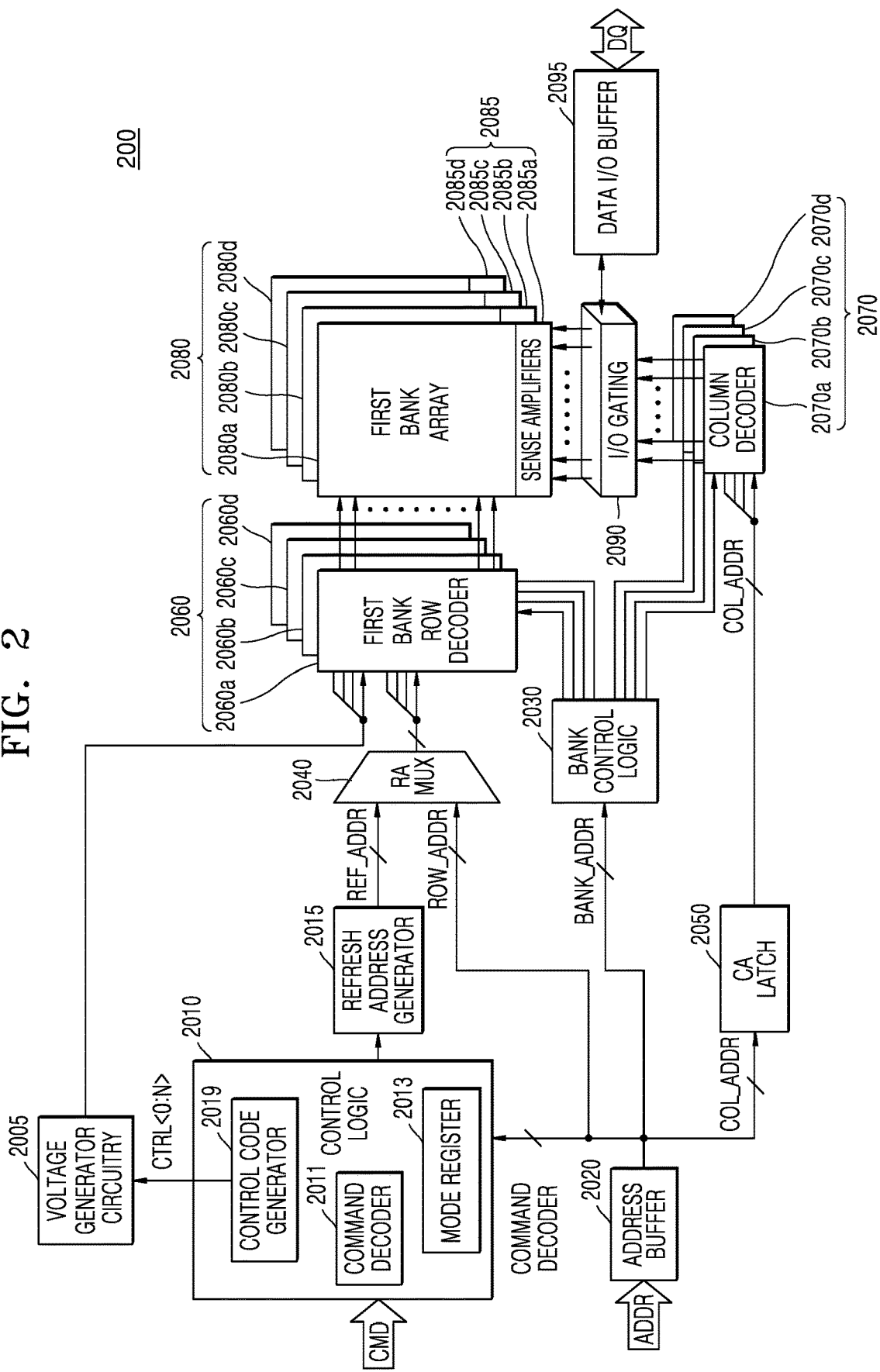
FIG. 2 is a block diagram illustrating a memory device according to an example embodiment.

FIG. 2 is a block diagram illustrating a memory device 200 according to an example embodiment. The memory device 200 may be implemented by DRAM.

Referring to FIG. 2, the memory device 200 may include a voltage generation circuit 2005, a control logic 2010, a refresh address generator 2015, an address buffer 2020, a bank control logic 2030, a row address multiplexer 2040, a column address latch 2050, a row decoder 2060, a column decoder 2070, a memory cell array 2080, a sense amplifier 2085, an input and output gating circuit 2090, and a data input and output buffer 2095.

The memory cell array 2080 may include first to fourth bank arrays 2080a, 2080b, 2080c, and 2080d. Each of the first to fourth bank arrays 2080a, 2080b, 2080c, and 2080d may include a plurality of word lines, a plurality of bit lines, and a plurality of memory cells formed at points at which the plurality of word lines intersect with the plurality of bit lines. Each of the first to fourth bank arrays 2080a, 2080b, 2080c, and 2080d may include the memory cell array 210 and the sub word line driving circuit 220 of FIG. 1.

The row decoder 2060 may include first to fourth bank row decoders 2060a, 2060b, 2060c, and 2060d respectively connected to the first to fourth bank arrays 2080a, 2080b, 2080c, and 2080d, the column decoder 2070 may include first to fourth bank column decoders 2070a, 2070b, 2070c, and 2070d respectively connected to the first to fourth bank arrays 2080a, 2080b, 2080c, and 2080d, and the sense amplifier 2085 may include first to fourth bank sense amplifiers 2085a, 2085b, 2085c, and 2085d respectively connected to the first to fourth bank arrays 2080a, 2080b, 2080c, and 2080d. Each of the first to fourth bank row decoders 2060a, 2060b, 2060c, and 2060d may be the row address decoder 230 of FIG. 1.

The first to fourth bank arrays 2080a, 2080b, 2080c, and 2080d, the first to fourth bank row decoders 2060a, 2060b, 2060c, and 2060d, the first to fourth bank column decoders 2070a, 2070b, 2070c, and 2070d, and the first to fourth bank sense amplifiers 2085a, 2085b, 2085c, and 2085d may respectively configure first to fourth memory banks. In the current embodiment, an example of the memory device 200 including four memory banks is illustrated. However, according to an embodiment, the memory device 200 may include an arbitrary number of memory banks.

The control logic 2010 may control overall operations of the memory device 200. The control logic 2010 may generate control signals so that the memory device 200 performs a write operation or a read operation. The control logic 2010 may include a command decoder 2011 for decoding a command CMD received from the host device 100, a mode register 2013 for setting an operation mode of the memory device 200, and a control code generator 2019. The command decoder 2011 may generate control signals corresponding to the command CMD by decoding a write enable signal /WE, a row address strobe signal /RAS, a column address strobe signal /CAS, and a chip select signal /CS. The mode register 2013 may provide a plurality of operation options of the memory device 200 and may program various functions, characteristics, and modes of the memory device 200.

The control logic 2010 may control the refresh address generator 2015 to perform an auto-refresh operation in response to a refresh command or may control the refresh address generator 2015 to perform a self-refresh operation in response to a self-refresh entry command. The refresh address generator 2015 may generate a refresh address REF_ADDR corresponding to a memory cell row on which a refresh operation is to be performed. The refresh address generator 2015 may generate the refresh address REF_ADDR in a refresh period defined by a standard of a volatile memory device.

The address buffer 2020 may receive the address ADDR including a bank address BANK_ADDR, a row address ROW_ADDR, and a column address COL_ADDR from a memory controller. In addition, the address buffer 2020 may provide the received bank address BANK_ADDR to the bank control logic 2030, may provide the received row address ROW_ADDR to the row address multiplexer 2040, and may provide the received column address COL_ADDR to the column address latch 2050.

The bank control logic 2030 may generate bank control signals in response to the bank address BANK_ADDR. In response to the bank control signals, among the first to fourth bank row decoders 2060a, 2060b, 2060c, and 2060d, a bank row decoder corresponding to the bank address BANK_ADDR may be activated and, among the first to fourth bank column decoders 2070a, 2070b, 2070c, and 2070d, a bank column decoder corresponding to the bank address BANK_ADDR may be activated.

The row address multiplexer 2040 may receive the row address ROW_ADDR from the address buffer 2020 and may receive the refresh row address REF_ADDR from the refresh address generator 2015. The row address multiplexer 2040 may selectively output the row address ROW_ADDR or the refresh row address REF_ADDR. The row address ROW_ADDR or the refresh row address REF_ADDR output from the row address multiplexer 2040 may be applied to each of the first to fourth bank row decoders 2060a, 2060b, 2060c, and 2060d.

Among the first to fourth bank row decoders 2060a, 2060b, 2060c, and 2060d, a bank row decoder activated by the bank control logic 2030 may decode the row address ROW_ADDR or the refresh row address REF_ADDR output from the row address multiplexer 2040 and may activate a word line corresponding to the row address ROW_ADDR or the refresh row address REF_ADDR. For example, the activated bank row decoder may apply a word line driving voltage to the word line corresponding to the row address ROW_ADDR or the refresh row address REF_ADDR.

The column address latch 2050 may receive the column address COL_ADDR from the address buffer 2020 and may temporarily store the received column address COL_ADDR. The column address latch 2050 may gradually increase the column address COL_ADDR received in a burst mode. The column address latch 2050 may apply the temporarily stored or gradually increased column address COL_ADDR to each of the first to fourth bank column decoders 2070a, 2070b, 2070c, and 2070d.

Among the first to fourth bank column decoders 2070a, 2070b, 2070c, and 2070d, a bank column decoder activated by the bank control logic 2030 may activate a sense amplifier corresponding to the bank address BANK_ADDR and the column address COL_ADDR through the input and output gating circuit 2090.

The input and output gating circuit 2090 may include input data mask logic, read data latches for storing read data output from the first to fourth bank arrays 2080a, 2080b, 2080c, and 2080d, and a write driver for writing data in the first to fourth bank arrays 2080a, 2080b, 2080c, and 2080d together with circuits gating the input and output data DQ.

Read data output from one bank array of the first to fourth bank arrays 2080a, 2080b, 2080c, and 2080d may be sensed by sense amplifiers corresponding to the one bank array and may be stored in the read data latches. Write data to be written in a memory cell array of the one bank array of the first to fourth bank arrays 2080a, 2080b, 2080c, and 2080d may be provided from the memory controller to the data input and output buffer 2095. The write data provided to the data input and output buffer 2095 may be written in one bank array through the write driver.

The data input and output buffer 2095 may receive a test pattern signal provided by a tester (300 of FIG. 1) when a wafer level is tested as the input and output data DQ and may provide the test pattern signal to the input and output gating circuit 2090. The input and output gating circuit 2090 may write the test pattern signal in a target page of the memory cell array 2080 when the wafer level is tested, may read the test pattern signal from the target page, and may provide the read test pattern signal to the data input and output buffer 2095 as a test result signal. The data input and output buffer 2095 may output the test result signal as the input and output data DQ.

Figure 3:
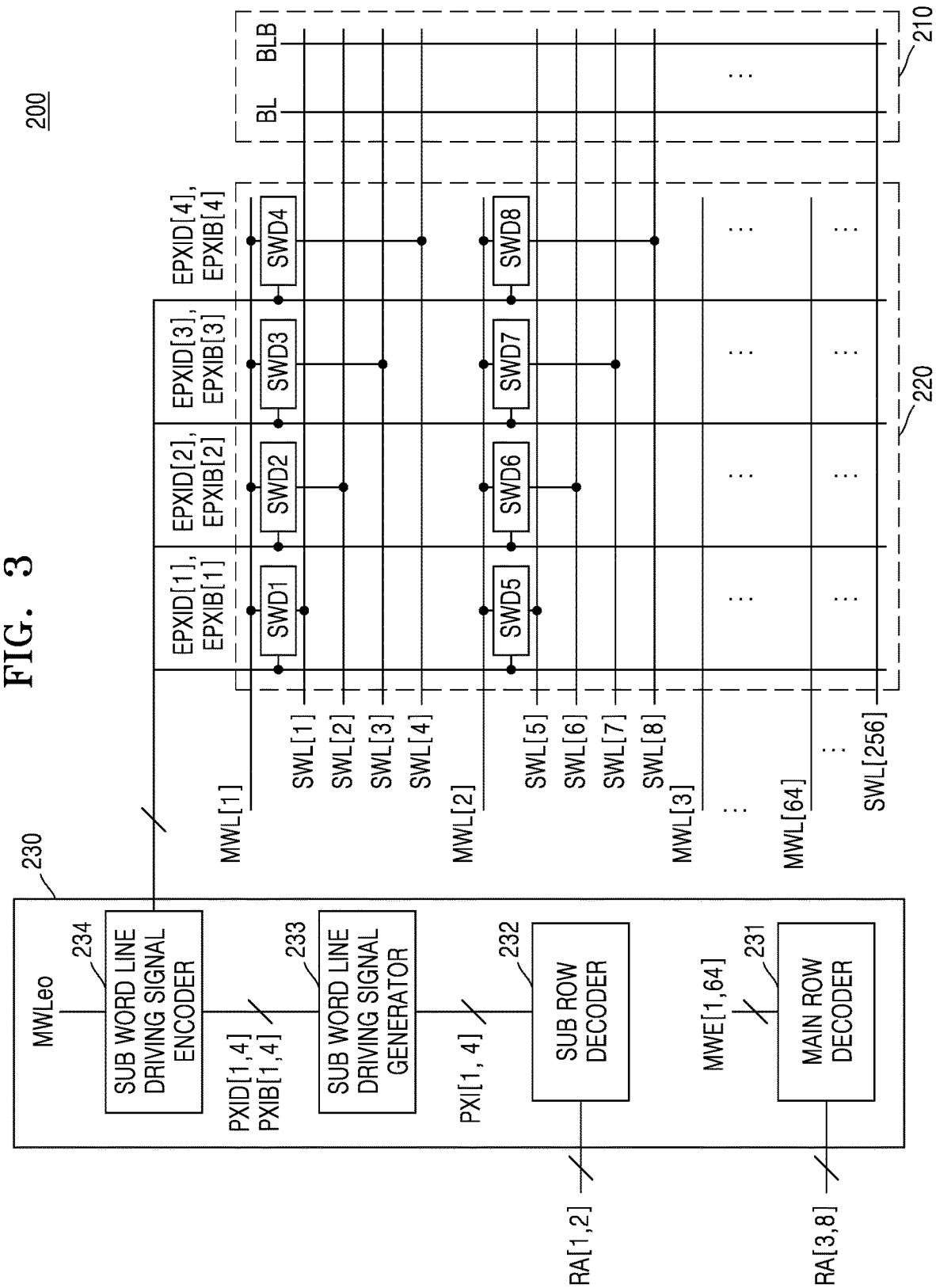
FIG. 3 is a view illustrating a memory device according to an example embodiment.

FIG. 3 is a view illustrating a memory device 200 according to an example embodiment.

Referring to FIG. 3, the memory device 200 may include a memory cell array 210, a sub word line driving circuit 220, and a row address decoder 230. Although not shown, the memory device 200 may further include at least one of the components illustrated in FIG. 2.

The memory cell array 210 may include a plurality of memory cells (not shown) connected to a plurality of word lines and a plurality of bit lines. A memory cell may be connected to a point at which a word line intersects with a bit line. In FIG. 3, the plurality of word lines may be referred to as a plurality of sub word lines. Referring to FIG. 3, the memory cell array 210 may include the plurality of memory cells connected to the plurality of sub word lines SWL[1, 256], a bit line BL, and a complementary bit line BLB.

The sub word line driving circuit 220 may be connected to a plurality of main word lines MWL[1,64]. The plurality of main word lines MWL[1,64] may be activated by a plurality of main word line driving signals MWE[1,64]. The sub word line driving circuit 220 may include a plurality of sub word line drivers (for example, SWD1). Each of the plurality of sub word line drivers may be connected to one of the plurality of main word lines MWL[1,64] and one of the plurality of sub word lines SWL[1,256]. The plurality of sub word line drivers connected to the plurality of activated main word lines may drive the plurality of sub word lines based on a plurality of first and second encoded sub word line driving signals EPXID[1,4] and EPXIB[1,4].

The row address decoder 230 may receive a plurality of row addresses RA[1,8] and may output the plurality of main word line driving signals MWE[1,64] and the plurality of first and second encoded sub word line driving signals EPXID[1,4] and EPXIB[1,4]. The plurality of main word line driving signals MWE[1,64] may respectively correspond to the plurality of main word lines MWL[1,64]. The number of bits included in the row address ROW_ADDR is not limited thereto, and the number of encoded sub word line driving signals is not limited thereto.

The row address decoder 230 may include a main row decoder 231, a sub row decoder 232, a sub word line driving signal generator 233, and a sub word line driving signal encoder 234.

The main row decoder 231 may generate the plurality of main word line driving signals MWE[1,64] by using a plurality of first bits RA[3,8] included in the plurality of row addresses RA[1,8]. One of the plurality of main word line driving signals MWE[1,64] may be activated in accordance with the plurality of first bits RA[3,8]. Based on the activated main word line driving signal, a corresponding main word line may be activated. The number of first bits is not limited thereto, and the number of main word line driving signals is not limited thereto.

The sub row decoder 232 may generate a plurality of sub word line signals PXI[1,4] by using a plurality of second bits RA[1,2] included in the plurality of row addresses RA[1,8]. One of the plurality of sub word line signals PXI[1,4] may be activated in accordance with the plurality of second bits RA[1,2]. The number of second bits is not limited thereto, and the number of sub word line signals is not limited thereto.

The sub word line driving signal generator 233 may receive the plurality of sub word line signals PXI[1,4] and may generate a plurality of first sub word line driving signals PXID[1,4] and a plurality of second sub word line driving signals PXIB[1,4].

The sub word line driving signal generator 233 may generate the plurality of first sub word line driving signals PXID[1,4] by delaying the plurality of sub word line signals PXI[1,4] and may generate the plurality of second sub word line driving signals PXIB[1,4] by inverting the plurality of sub word line signals PXI[1,4].

The sub word line driving signal encoder 234 may receive the plurality of first sub word line driving signals PXID[1,4], the plurality of second sub word line driving signals PXIB[1,4], and the odd even signal MWLeo and may generate a plurality of first encoded sub word line driving signals EPXID[1,4] and a plurality of second encoded sub word line driving signals EPXIB[1,4]. The odd even signal MWLeo may represent whether a main word line selected by a plurality of second bits RA[3,8] is an odd or even main word line. For example, the odd even signal MWLeo may correspond to the first bit RA[3] of the plurality of second bits RA[3,8]. Alternatively, the odd even signal MWLeo may represent whether the activated main word line signal selects the even main word line or the odd main word line.

The sub word line driving signal encoder 234 may generate the plurality of first encoded sub word line driving signals EPXID[1,4] by outputting the plurality of first sub word line driving signals PXID[1,4] in different orders based on the odd even signal MWLeo. For example, when the odd even signal MWLeo represents an odd signal, the sub word line driving signal encoder 234 may generate the plurality of first encoded sub word line driving signals EPXID[1,4] by outputting the plurality of first sub word line driving signals PXID[1,4] in a first order. Specifically, when the odd even signal MWLeo represents the odd signal, the sub word line driving signal encoder 234 may generate EPXID[1], EPXID[2], EPXID[3], and EPXID[4] by outputting the plurality of first sub word line driving signals PXID[1,4] in the order of PXID[2], PXID[1], PXID[3], and PXID[4]. That is, when the odd even signal MWLeo represents the odd signal, EPXID[1] may be PXID[2], EPXID[2] may be PXID[1], EPXID[3] may be PXID[3], and EPXID[4] may be PXID [4]. When the odd even signal MWLeo represents an even signal, the sub word line driving signal encoder 234 may generate the plurality of first encoded sub word line driving signals EPXID[1,4] by outputting the plurality of first sub word line driving signals PXID[1,4] in a second order. Specifically, when the odd even signal MWLeo represents the even signal, the sub word line driving signal encoder 234 may generate EPXID[1], EPXID[2], EPXID[3], and EPXID [4] by outputting the plurality of first sub word line driving signals PXID[1,4] in the order of PXID[3], PXID[4], PXID [1], and PXID[2]. That is, when the odd even signal MWLeo represents the even signal, EPXID[1] may be PXID[3], EPXID[2] may be PXID[4], EPXID[3] may be PXID[1], and EPXID[4] may be PXID [2].

Only a method of encoding the plurality of first encoded sub word line driving signals EPXID[1,4] is described. In example embodiments, the plurality of second encoded sub word line driving signals EPXIB[1,4] may also be encoded by the same method.

According to an example embodiment, because the plurality of first and second encoded sub word line driving signals EPXID and EPXIB may be respectively encoded by the plurality of first and second sub word line driving signals PXID and PXIB in accordance with the odd even signal MWLeo, the degree of freedom of routing for the plurality of first and second encoded sub word line driving signals EPXID and EPXIB may increase.

Figure 4A:
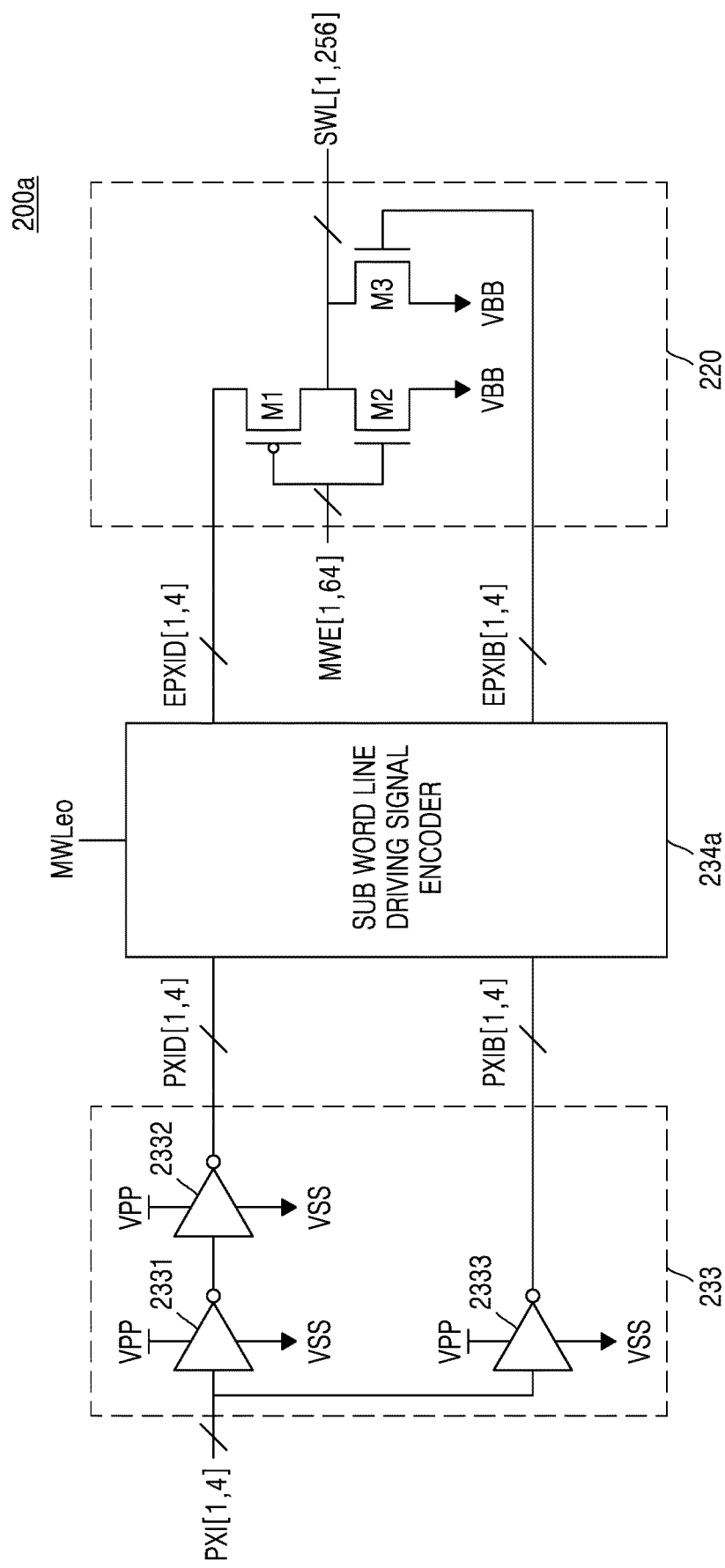
FIGS. 4A to 4C are views illustrating memory devices according to an example embodiment.
Figure 4B:
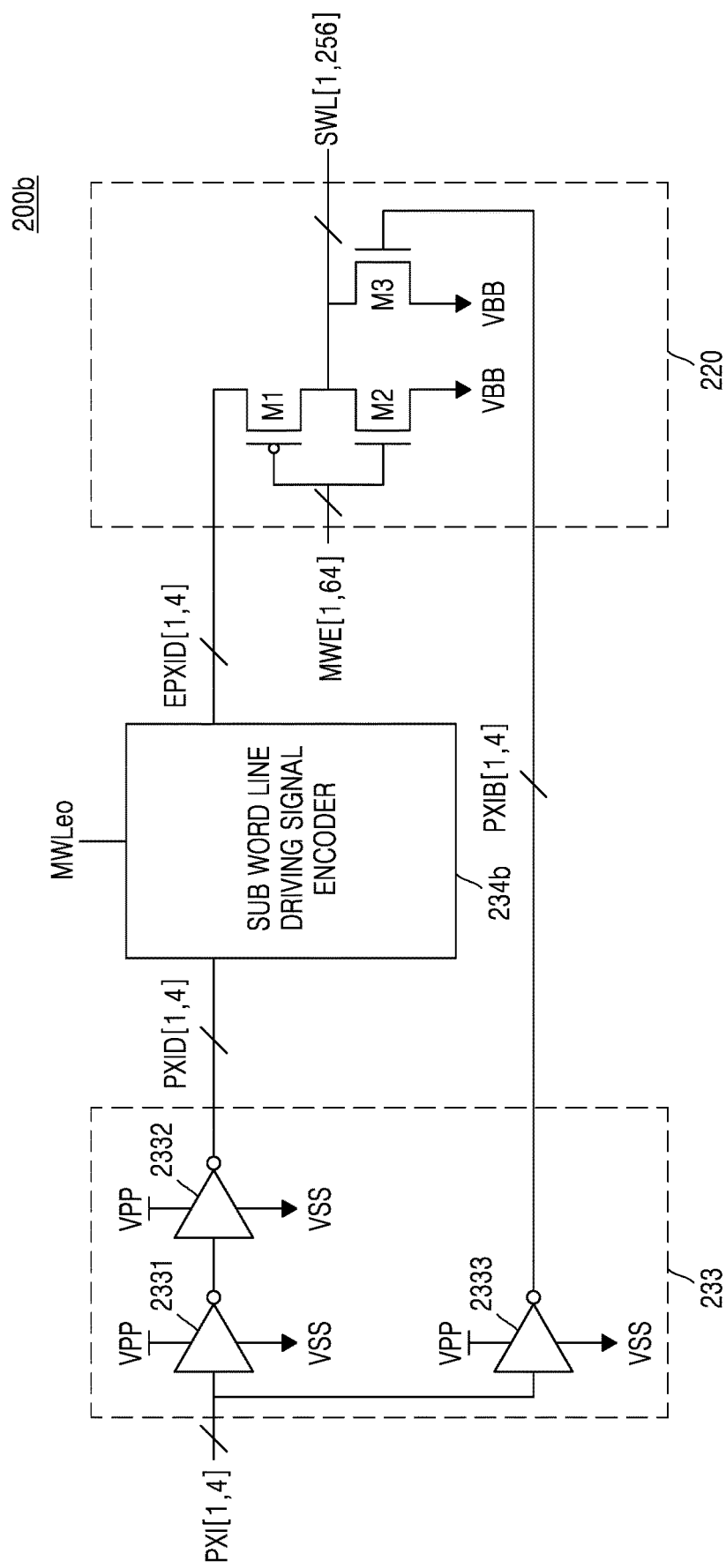
Figure 4C:
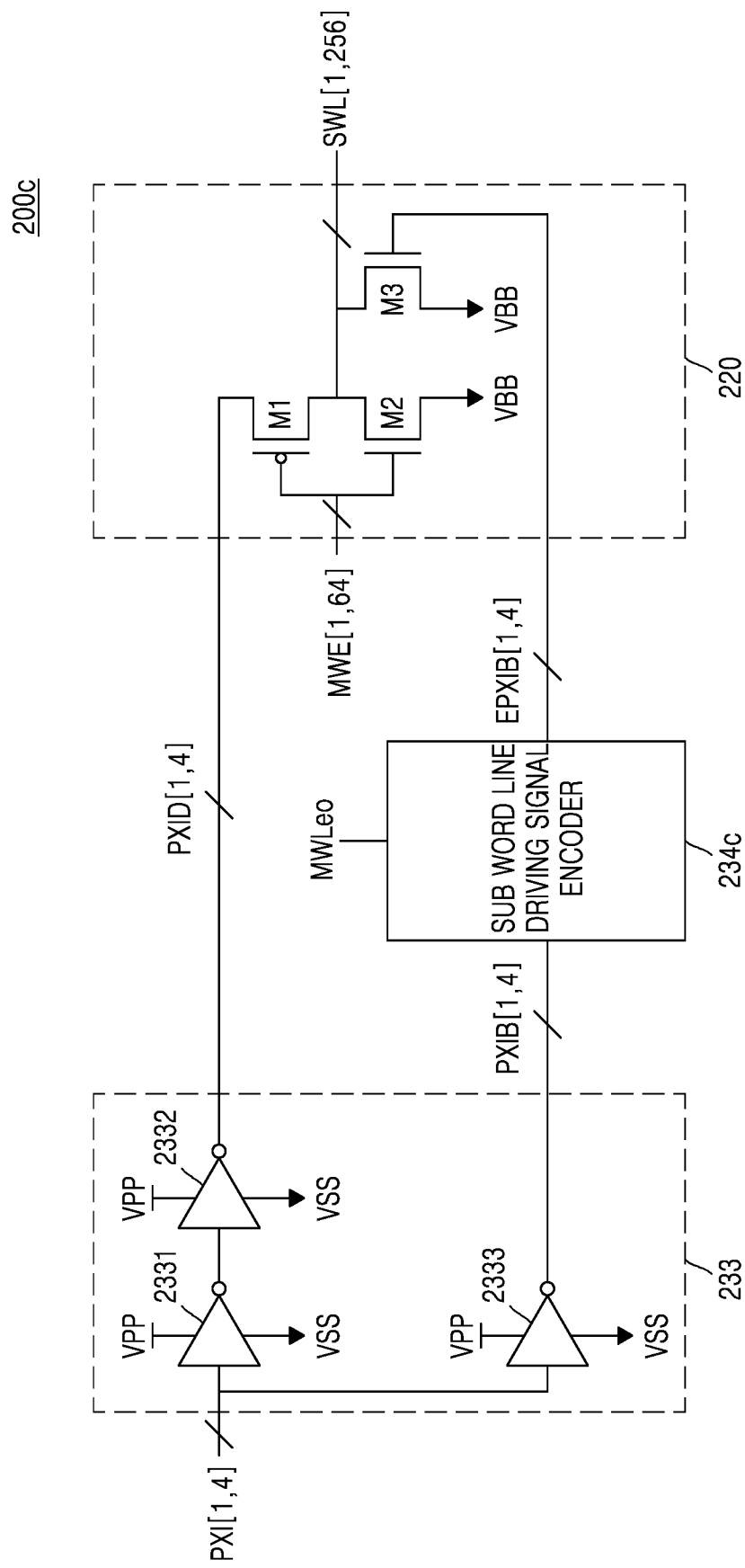

FIGS. 4A to 4C are views illustrating memory devices 200a, 200b, and 200c according to example embodiments.

Referring to FIG. 4A, the memory device 200a may include a sub word line driving signal generator 233, a sub word line driving signal encoder 234a, and a sub word line driving circuit 220.

The sub word line driving signal generator 233 may receive a plurality of sub word line signals PX[1,4] and may generate the plurality of first sub word line driving signals PXID[1,4] and the plurality of second sub word line driving signals PXIB[1,4].

The sub word line driving signal generator 233 may include first to third inverters 2331 to 2333. The first to third inverters 2331 to 2333 may output a signal at a first voltage level VPP or a second voltage level VSS. The first and second inverters 2331 and 2332 may generate the plurality of first sub word line driving signals PXID[1,4] by delaying the plurality of sub word line signals PX[1,4]. The third inverter 2333 may generate the plurality of second sub word line driving signals PXIB[1,4] by inverting the plurality of sub word line signals PX[1,4].

The sub word line driving signal encoder 234a may receive the plurality of first and second sub word line driving signals PXID[1,4] and PXIB[1,4] and may generate the plurality of first and second encoded sub word line driving signals EPXID[1,4] and EPXIB [1,4] based on the odd even signal MWLeo.

The sub word line driving circuit 220 may receive the plurality of first encoded sub word line driving signals EPXID[1,4], the plurality of second encoded sub word line driving signals EPXIB[1,4], and the plurality of main word line driving signals WE[1,64] and may drive the plurality of sub word lines SWL[1,256]. For example, the sub word line driving circuit 220 may drive the plurality of sub word lines SWL[1,256] at the first voltage level VPP or a third voltage level VBB.

The sub word line driving circuit 220 may include first to third transistors M1 to M3. The first transistor M1 may be a p-type transistor. The plurality of main word line driving signals MWE[1,64] may be input to a gate end of the first transistor M1, the plurality of first encoded sub word line driving signals EPXID[1,4] may be input to a source end of the first transistor M1, and the plurality of sub word lines SWL[1,256] may be connected to a drain end of the first transistor M1. The second transistor M2 and the third transistor M3 may be n-type transistors. The plurality of main word line driving signals MWE[1,64] may be input to a gate end of the second transistor M2, a node at the third voltage level VBB may be connected to a source end of the second transistor M2, and the plurality of sub word lines SWL[1,256] may be connected to a drain end of the second transistor M2. The plurality of second encoded sub word line driving signals EPXIB[1,4] may be input to a gate end of the third transistor M3, the node at the third voltage level VBB may be connected to a source end of the third transistor M3, and the plurality of sub word lines SWL[1,256] may be connected to a drain end of the third transistor M3.

The sub word line driving circuit 220 may drive a sub word line by receiving the plurality of first and second encoded sub word line driving signals EPXID[1,4] and EPXIB[1,4] and the plurality of main word line driving signals MWE[1,64].

Referring to FIG. 4B, the memory device 200b may include a sub word line driving signal encoder 234b. The sub word line driving signal encoder 234b may receive the plurality of first sub word line driving signals PXID[1,4] and may generate the plurality of first encoded sub word line driving signals EPXID[1,4] based on the odd even signal MWLeo. As illustrated in FIG. 4B, the sub word line driving circuit 220 may receive the plurality of second sub word line driving signals PXIB[1,4] from the sub word line driving signal generator 233 and may drive the plurality of sub word lines SWL[1,256] based on the plurality of first encoded sub word line driving signals EPXID[1,4], the plurality of second sub word line driving signals PXIB[1,4], and the plurality of main word line driving signals WE[1,64].

Referring to FIG. 4C, the memory device 200c may include a sub word line driving signal encoder 234c. The sub word line driving signal encoder 234c may receive the plurality of second sub word line driving signals PXIB[1,4] and may generate the plurality of second encoded sub word line driving signals EPXIB[1,4] based on the odd even signal MWLeo. As illustrated in FIG. 4C, the sub word line driving circuit 220 may receive the plurality of first sub word line driving signals PXID[1,4] from the sub word line driving signal generator 233 and may drive the plurality of sub word lines SWL[1,256] based on the plurality of first sub word line driving signals PXID[1,4], the plurality of second encoded sub word line driving signals EPXIB[1,4], and the plurality of main word line driving signals WE[1,64].

Figure 5:
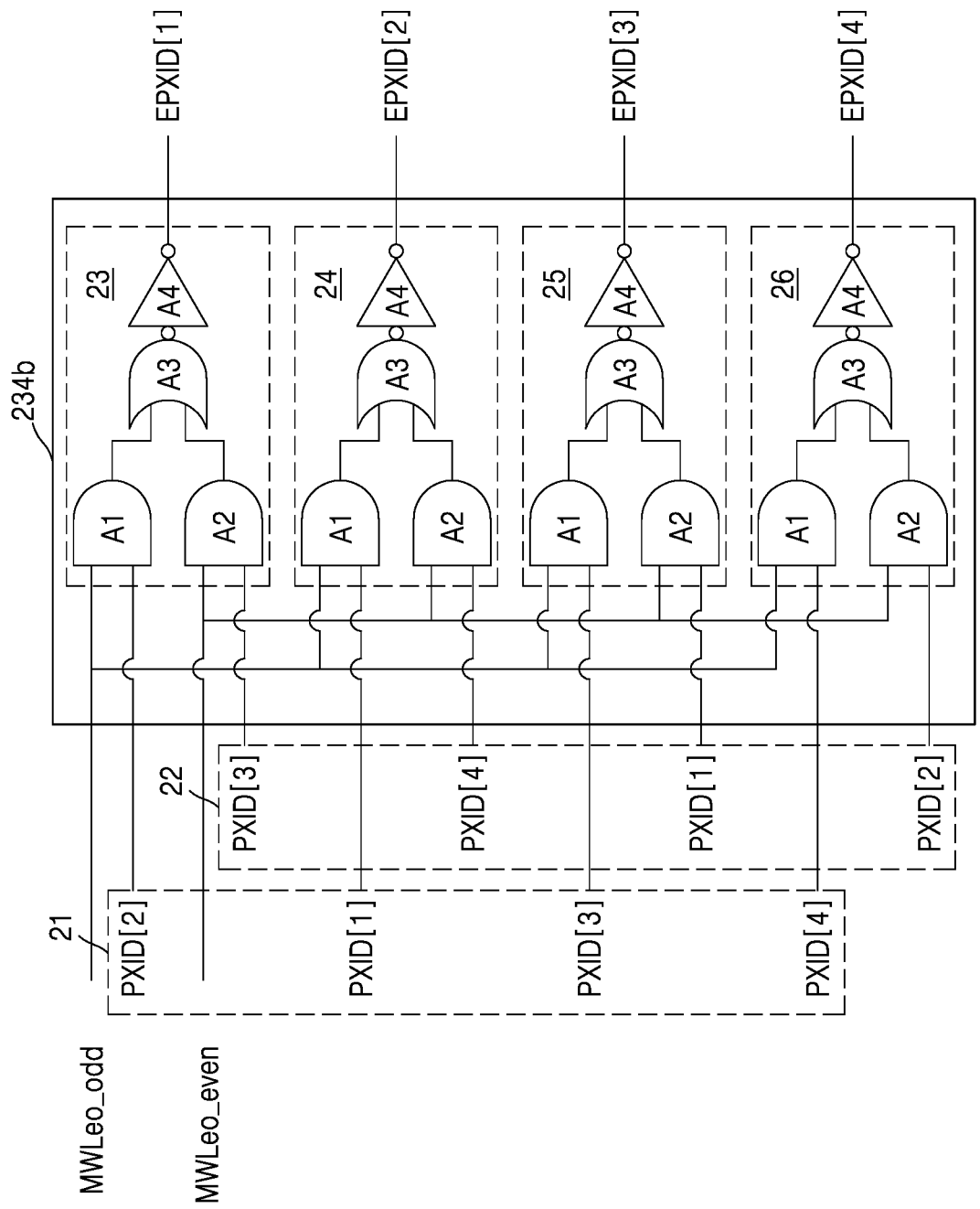
FIG. 5 is a view illustrating a sub word line driving signal encoder according to an example embodiment.

FIG. 5 is a view illustrating a sub word line driving signal encoder 234b according to an example embodiment.

Referring to FIG. 5, the sub word line driving signal encoder 234b may receive the plurality of first sub word line driving signals PXID[1,4] and odd even signals MWLeo_even and MWLeo_odd and may output the plurality of first encoded sub word line driving signals EPXID [1,4].

When the odd even signal MWLeo represents the odd signal, that is, when the odd signal MWLeo_odd is activated, the plurality of first sub word line driving signals PXID[1,4] 21 aligned in a first order may be output as the plurality of first encoded sub word line driving signals EPXID[1,4]. That is, EPXID[1] may be PXID[2], EPXID[2] may be PXID[1], EPXID[3] may be PXID[3], and EPXID[4] may be PXID[4].

When the odd even signal MWLeo represents the even signal, that is, when the even signal MWLeo_even is activated, the plurality of first sub word line driving signals PXID[1,4] 22 aligned in a second order may be output as the plurality of first encoded sub word line driving signals EPXID[1,4]. That is, EPXID[1] may be PXID[3], EPXID[2] may be PXID[4], EPXID[3] may be PXID[1], and EPXID[4] may be PXID[2].

That is, in accordance with the odd even signal MWLeo, the plurality of first encoded sub word line driving signals EPXID[1,4] may be respectively encoded into the plurality of first sub word line driving signals.

The sub word line driving signal encoder 234b may include a plurality of encoder circuits 23 to 26 outputting the plurality of first encoded sub word line driving signals EPXID[1,4].

Each of the plurality of encoder circuits 23 to 26 may include first and second AND gate circuits A1 and A2, NOR gate circuits A3, and inverters A4. The first AND gate circuits A1 may commonly receive the odd signal MWLeo_odd and may receive the plurality of first sub word line driving signals PXID[1,4] in the first order. The second AND gate circuits A2 may commonly receive the even signal MWLeo_even and may receive the plurality of first sub word line driving signals PXID[1,4] in a second order. The NOR gate circuits A3 may output resultant values of NOR operation performed on outputs of the first AND gate circuits A1 and outputs of the second AND gate circuits A2. The inverters A4 may receive the resultant values of the NOR operation and may output values obtained by inverting the resultant values as the plurality of first encoded sub word line driving signals EPXID[1,4].

The plurality of encoder circuits 23 to 26 may also be applied to the sub word line driving signal encoder 234a of FIG. 4A and the sub word line driving signal encoder 234c of FIG. 4C. For example, the sub word line driving signal encoder 234a may further include encoder circuits receiving the plurality of second sub word line driving signals PXIB[1,4] aligned in a third order and outputting the plurality of second encoded sub word line driving signals EPXIB[1,4] and encoder circuits receiving the plurality of second sub word line driving signals PXIB[1,4] aligned in a fourth order and outputting the plurality of second encoded sub word line driving signals EPXIB[1,4].

Figure 6:
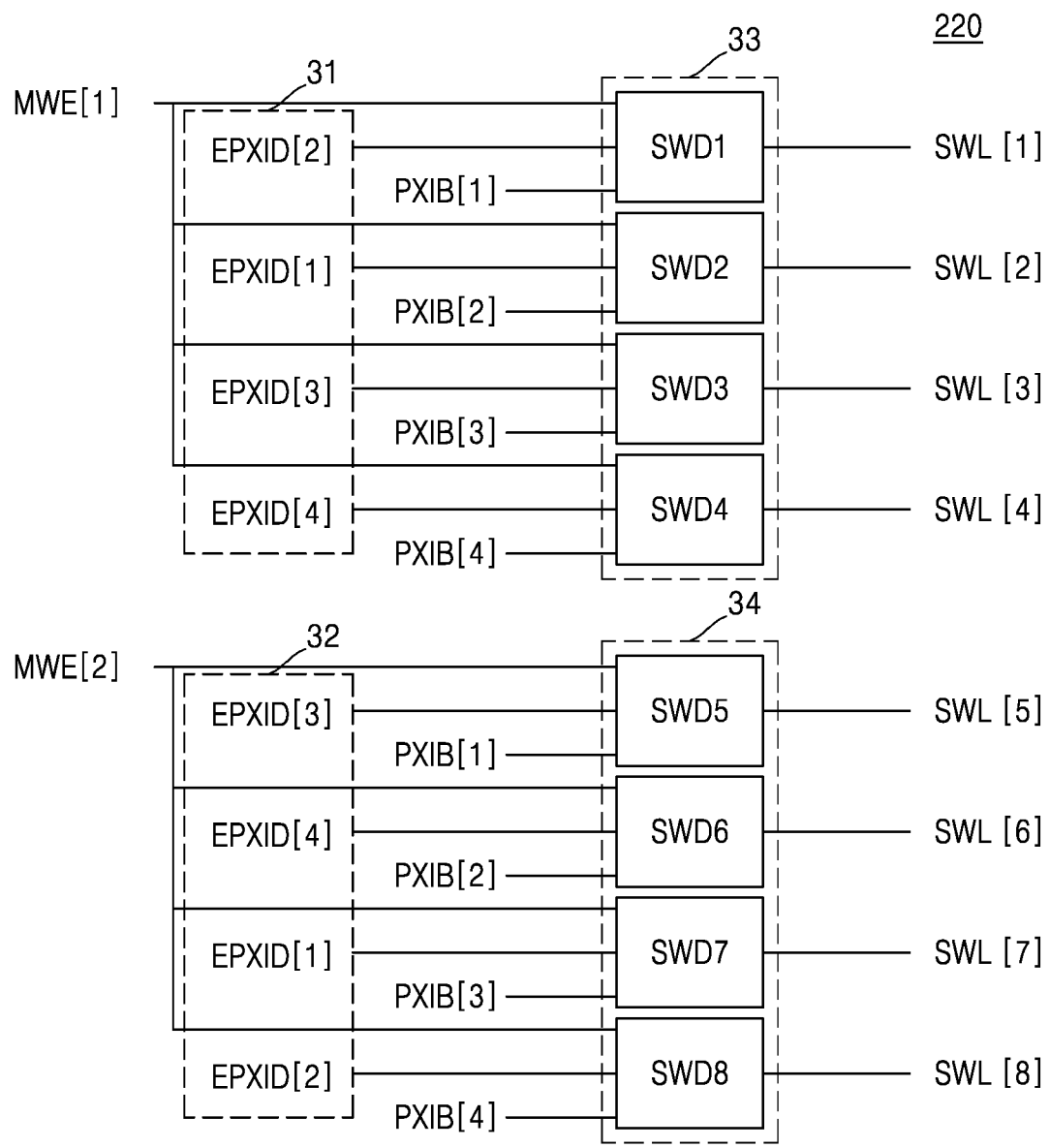
FIG. 6 is a view illustrating a sub word line driving circuit according to an example embodiment.

FIG. 6 is a view illustrating a sub word line driving circuit 220 according to an example embodiment.

Referring to FIG. 6, the sub word line driving circuit 220 may receive the plurality of main word line driving signals MWE[1,2], the plurality of first encoded sub word line driving signals EPXID[1,4], and the plurality of second encoded sub word line driving signals EPXIB[1,4] and may drive the plurality of sub word lines SWL[1,8]. The sub word line driving circuit 220 may be connected to the sub word line driving signal encoder 234b of FIG. 5.

The sub word line driving circuit 220 may include a plurality of first sub word line drivers 33 and a plurality of second sub word line drivers 34.

The plurality of first sub word line drivers 33 may be a plurality of sub word line drivers SWD1 to SWD4 receiving the plurality of first encoded sub word line driving signals EPXID[1,4] in the first order, indicated by item number 31. It is illustrated that the plurality of first sub word line drivers 33 receive the plurality of second sub word line driving signals PXIB[1,4]. However, in some embodiments, the plurality of first sub word line drivers 33 may receive the plurality of second encoded sub word line driving signals EPXIB[1,4] in the third order.

The plurality of second sub word line drivers 34 may be a plurality of sub word line drivers SWD5 to SWD8 receiving the plurality of first encoded sub word line driving signals EPXID[1,4] in the second order, indicated by item number 32. It is illustrated that the plurality of second sub word line drivers 34 receive the plurality of second sub word line driving signals PXIB[1,4]. However, in some embodiments, the plurality of second sub word line drivers 34 may receive the plurality of second encoded sub word line driving signals EPXIB[1,4] in the fourth order.

Although not shown, the sub word line driving circuit 220 may include a plurality of sub word line drivers receiving the plurality of remaining main word line driving signals MWE[3,64], the plurality of first encoded sub word line driving signals EPXID[1,4], and the plurality of second encoded sub word line driving signals EPXIB[1,4] and driving the plurality of remaining sub word lines SWL[9,256].

Figure 7:
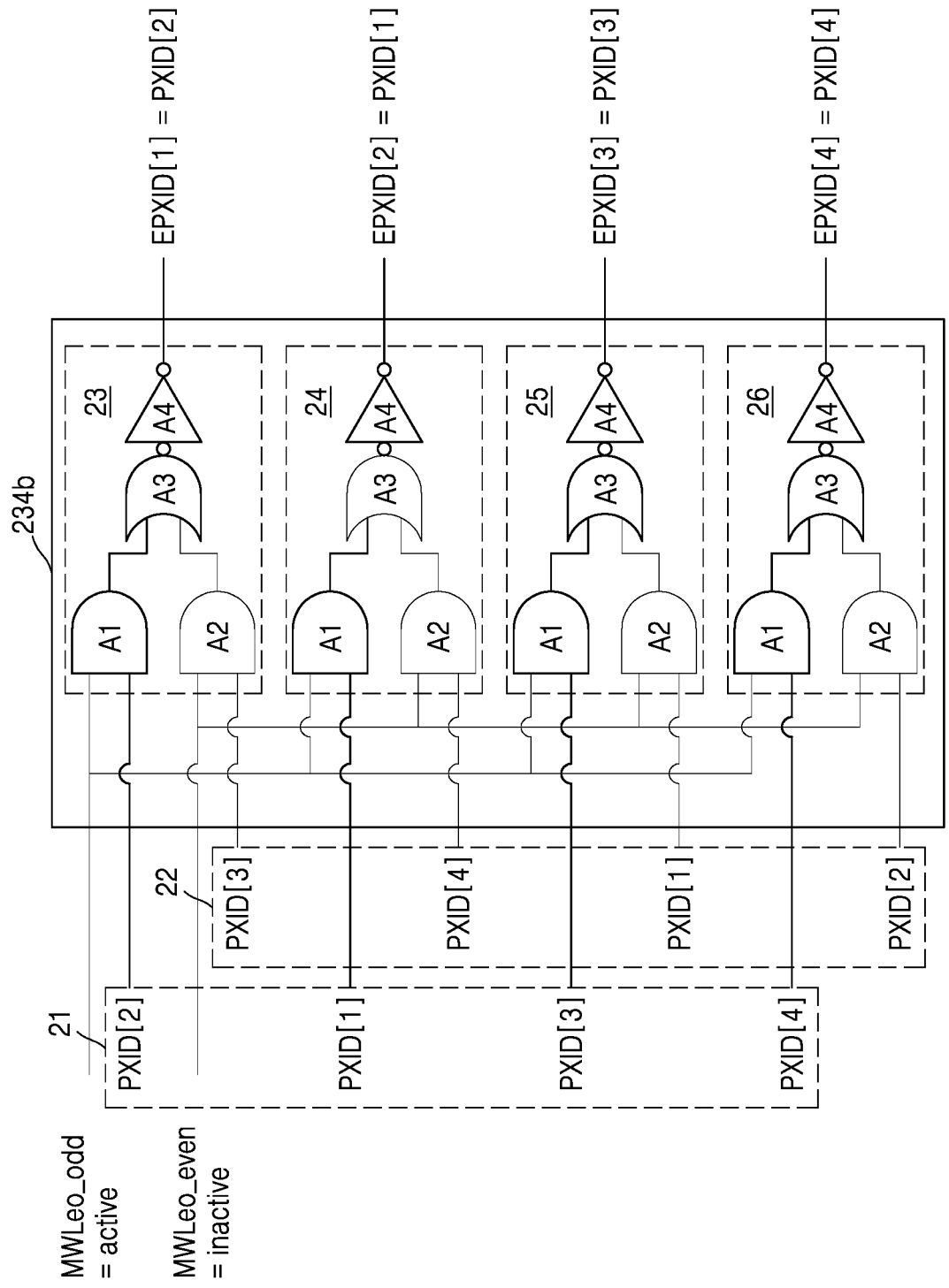
FIG. 7 is a view illustrating a first sub word line driving signal encoding method when an odd signal is activated according to an example embodiment.

FIG. 7 is a view illustrating a method of encoding a first sub word line driving signal when an odd signal is activated according to an example embodiment.

Referring to FIG. 7, when the odd signal MWLeo_odd is activated, the sub word line driving signal encoder 234b may output the plurality of first sub word line driving signals PXID[1,4] 21 aligned in the first order as the plurality of first encoded sub word line driving signals EPXID[1,4]. Therefore, EPXID[1] may be PXID[2], EPXID[2] may be PXID[1], EPXID[3] may be PXID[3], and EPXID[4] may be PXID[4].

Because the even signal MWLeo_even is inactivated, the sub word line driving signal encoder 234b may not output the plurality of first sub word line driving signals PXID[1,4] 22 aligned in the second order.

In some embodiments, the sub word line driving signal encoder 234b may further include encoder circuits for encoding the plurality of second sub word line driving signals PXIB[1,4]. In this case, when the odd signal MWLeo_odd is activated, the sub word line driving signal encoder 234b may output the plurality of second sub word line driving signals PXIB[1,4] aligned in the third order as the plurality of second encoded sub word line driving signals EPXIB[1,4]. Because the even signal MWLeo_even is inactivated, the sub word line driving signal encoder 234b may not output the plurality of second sub word line driving signals PXIB[1,4] aligned in the fourth order.

Figure 8:
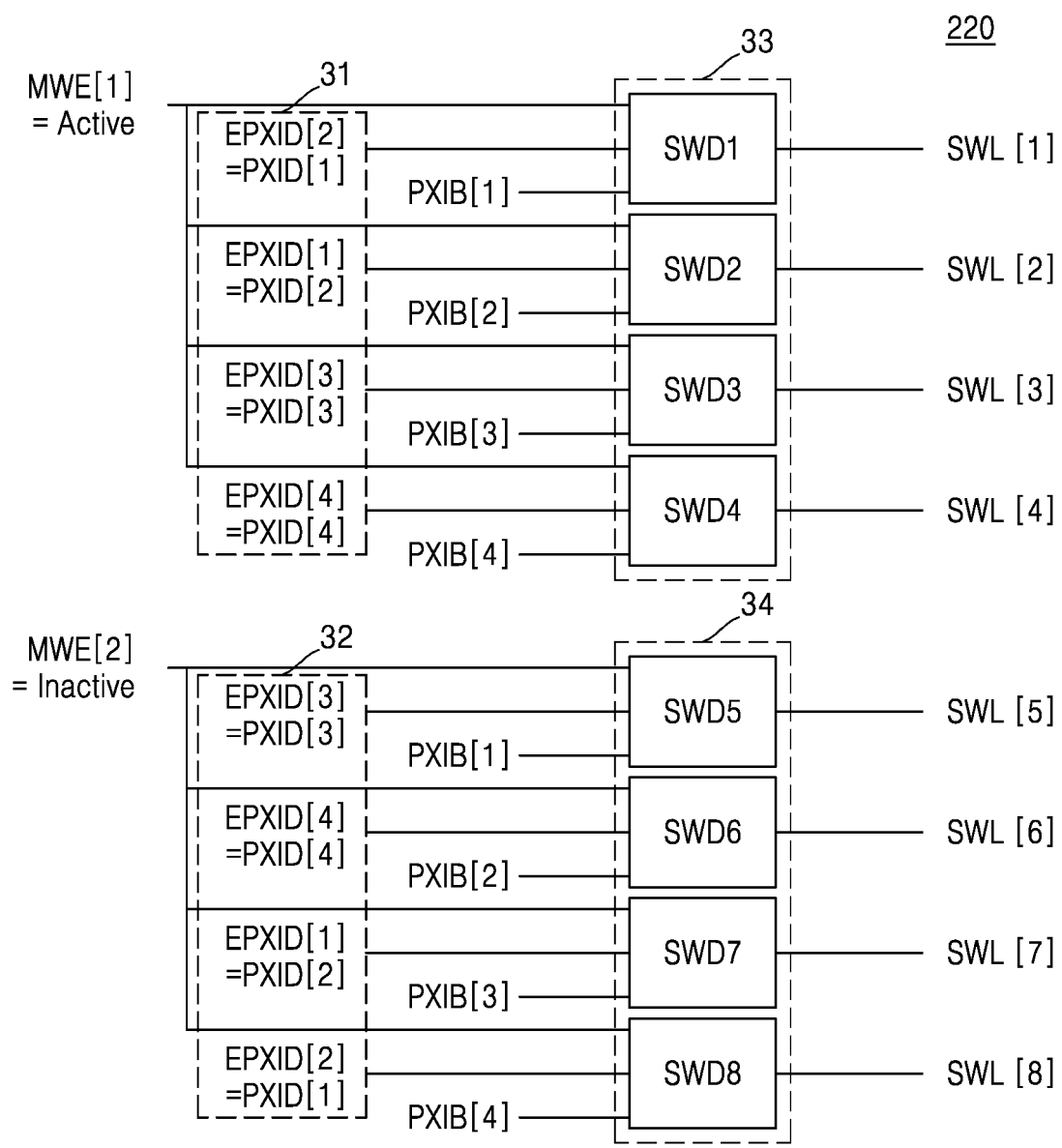
FIG. 8 is a view illustrating a sub word line driving method when an odd signal is activated according to an example embodiment.

FIG. 8 is a view illustrating a sub word line driving method when an odd signal is activated according to an example embodiment.

Referring to FIG. 8, when the main word line driving signal MWE[1] is activated so that the odd signal MWLeo_odd is activated, the plurality of first sub word line drivers 33 may receive the plurality of first encoded sub word line driving signals EPXID[1,4] 31 aligned in the first order. The first order may be the same as an order in which the plurality of first sub word line driving signals PXID[1,4] 21 input to the sub word line driving signal encoder 234b are aligned. That is, EPXID[2] may be applied to the sub word line driver SWD1, EPXID[1] may be applied to the sub word line driver SWD2, EPXID[3] may be applied to the sub word line driver SWD3, and EPXID[4] may be applied to the sub word line driver SWD4. By the sub word line driving signal encoder 234b of FIG. 7, because EPXID[2]=PXID[1], EPXID[1]=PXID[2], EPXID[3]=PXID[3], and EPXID[4]=PXID[4], each of the plurality of first sub word line drivers 33 may drive a sub word line by receiving the first and second sub word line driving signals PXID and PXIB generated by the same sub word line signal PXI.

Figure 9:
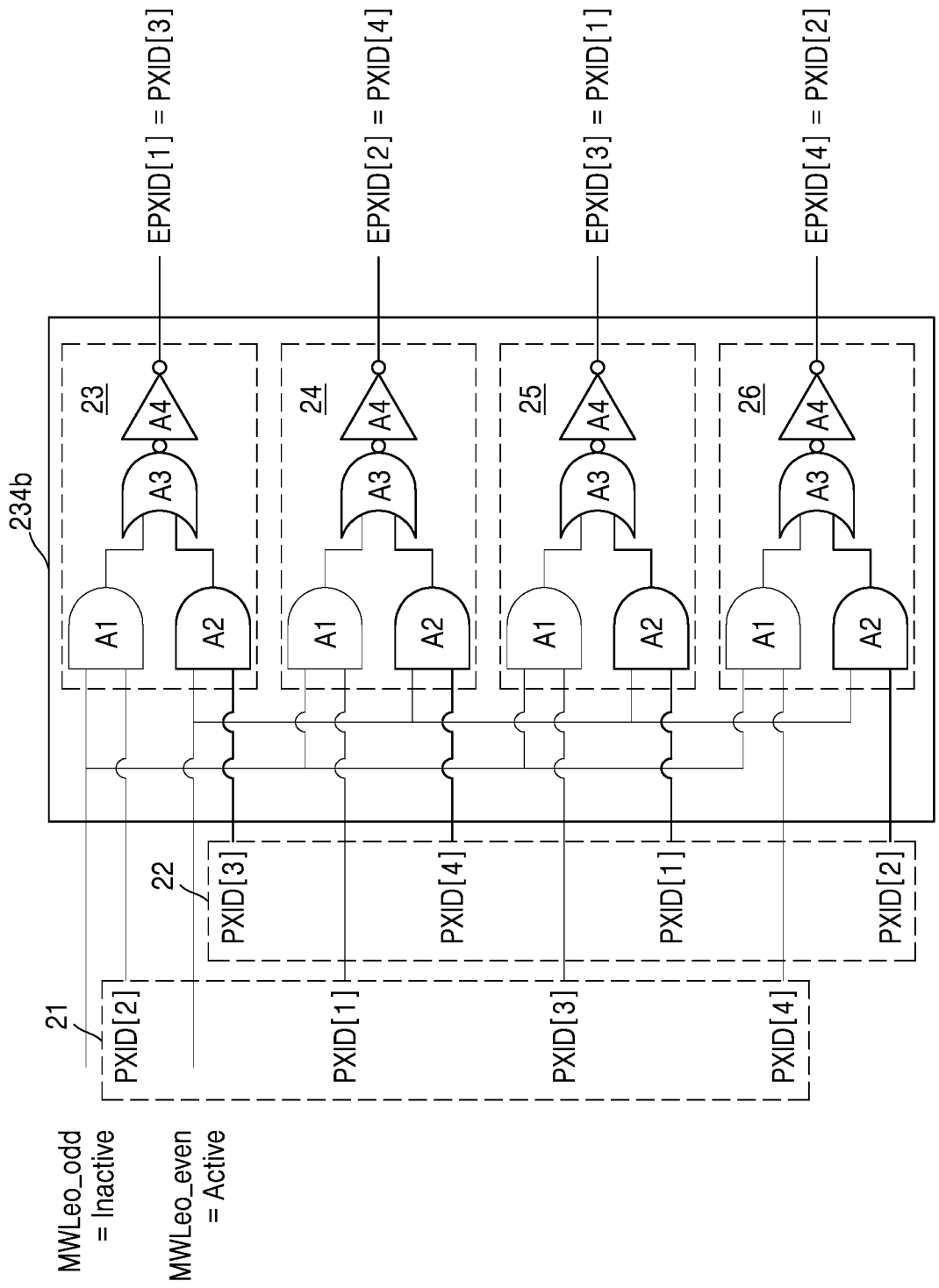
FIG. 9 is a view illustrating a first sub word line driving signal encoding method when an even signal is activated according to an example embodiment.

FIG. 9 is a view illustrating a first sub word line driving signal encoding method when an even signal MWLeo_even is activated according to an example embodiment.

Referring to FIG. 9, when the even signal MWLeo_even is activated, the sub word line driving signal encoder 234b may output the plurality of first sub word line driving signals PXID[1,4] 22 aligned in the second order as the plurality of first encoded sub word line driving signals EPXID[1,4]. Therefore, EPXID[1] may be PXID[3], EPXID[2] may be PXID[4], EPXID[3] may be PXID[1], and EPXID[4] may be PXID[2].

Because the odd signal MWLeo_odd is inactivated, the sub word line driving signal encoder 234b may not output the plurality of first sub word line driving signals PXID[1,4] 21 aligned in the first order.

In some embodiments, the sub word line driving signal encoder 234b may further include encoder circuits for encoding the plurality of second sub word line driving signals PXIB[1,4]. In this case, when the odd signal MWLeo_odd is activated, the sub word line driving signal encoder 234b may output the plurality of second sub word line driving signals PXIB[1,4] aligned in the third order as the plurality of second encoded sub word line driving signals EPXIB[1,4]. Because the even signal MWLeo_even is inactivated, the sub word line driving signal encoder 234b may not output the plurality of second sub word line driving signals PXIB[1,4] aligned in the fourth order.

Figure 10:
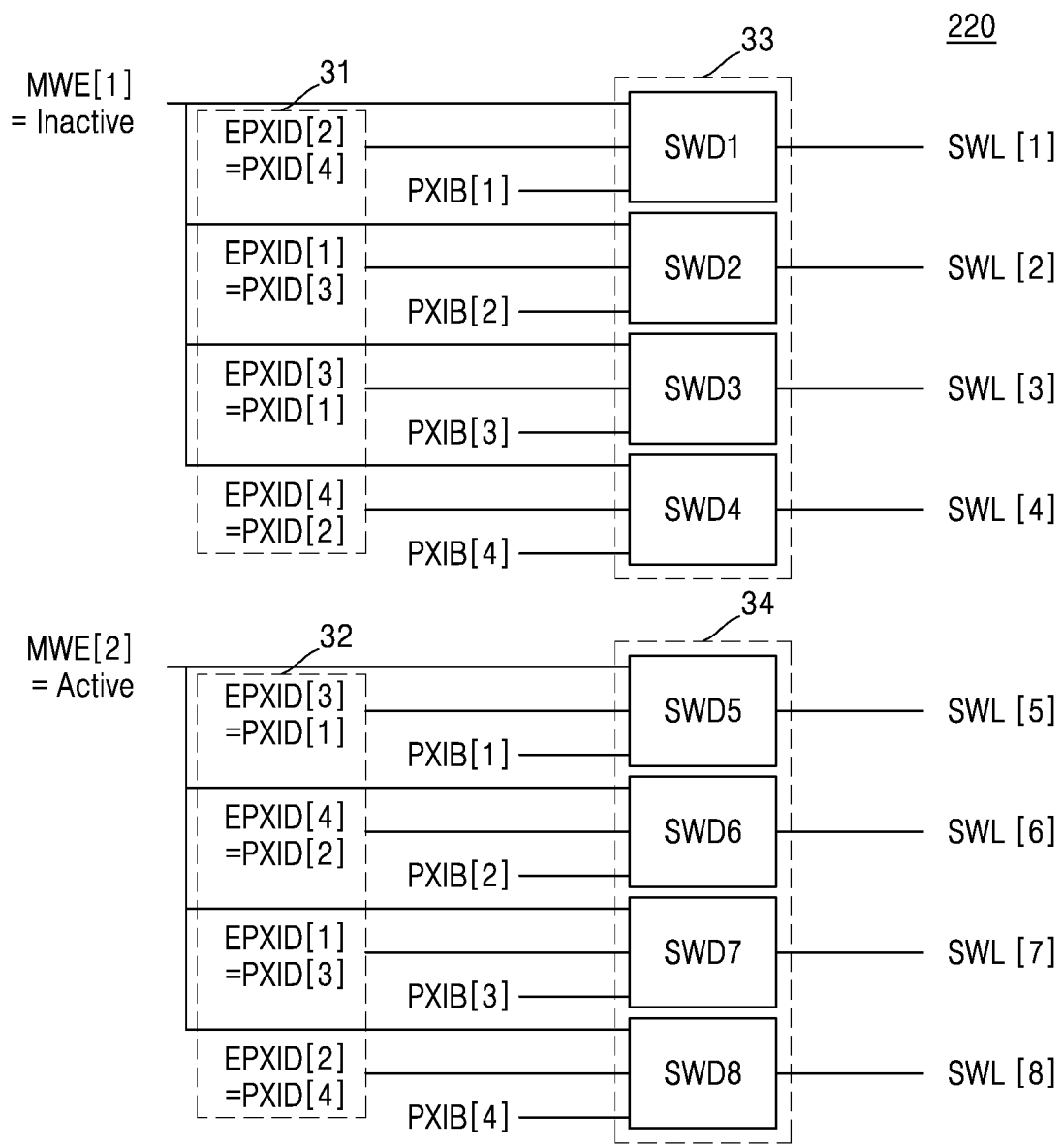
FIG. 10 is a view illustrating a sub word line driving method when an even signal is activated according to an example embodiment.

FIG. 10 is a view illustrating a sub word line driving method when an even signal MWLeo_even is activated according to an example embodiment.

Referring to FIG. 10, when the main word line driving signal MWE[2] is activated so that the even signal MWLeo_even is activated, the plurality of second sub word line drivers 34 may receive a plurality of first encoded sub word line driving signals EPXID[1,4] 32 aligned in the second order. The second order may be the same as an order in which the plurality of first sub word line driving signals PXID[1,4] 22 input to the sub word line driving signal encoder 234b of FIG. 9 are aligned. That is, EPXID[3] may be applied to the sub word line driver SWD5, EPXID[4] may be applied to the sub word line driver SWD6, EPXID [1] may be applied to the sub word line driver SWD7, and EPXID[2] may be applied to the sub word line driver SWD8. By the sub word line driving signal encoder 234b of FIG. 9, because EPXID[3]=PXID [1], EPXID [4]=PXID [2], EPXID [1]=PXID [3], and EPXID [2]=PXID [4], each of the plurality of second sub word line drivers 34 may drive a sub word line by receiving the first and second sub word line driving signals PXID and PXIB generated by the same sub word line signal PXI.

Figure 11:
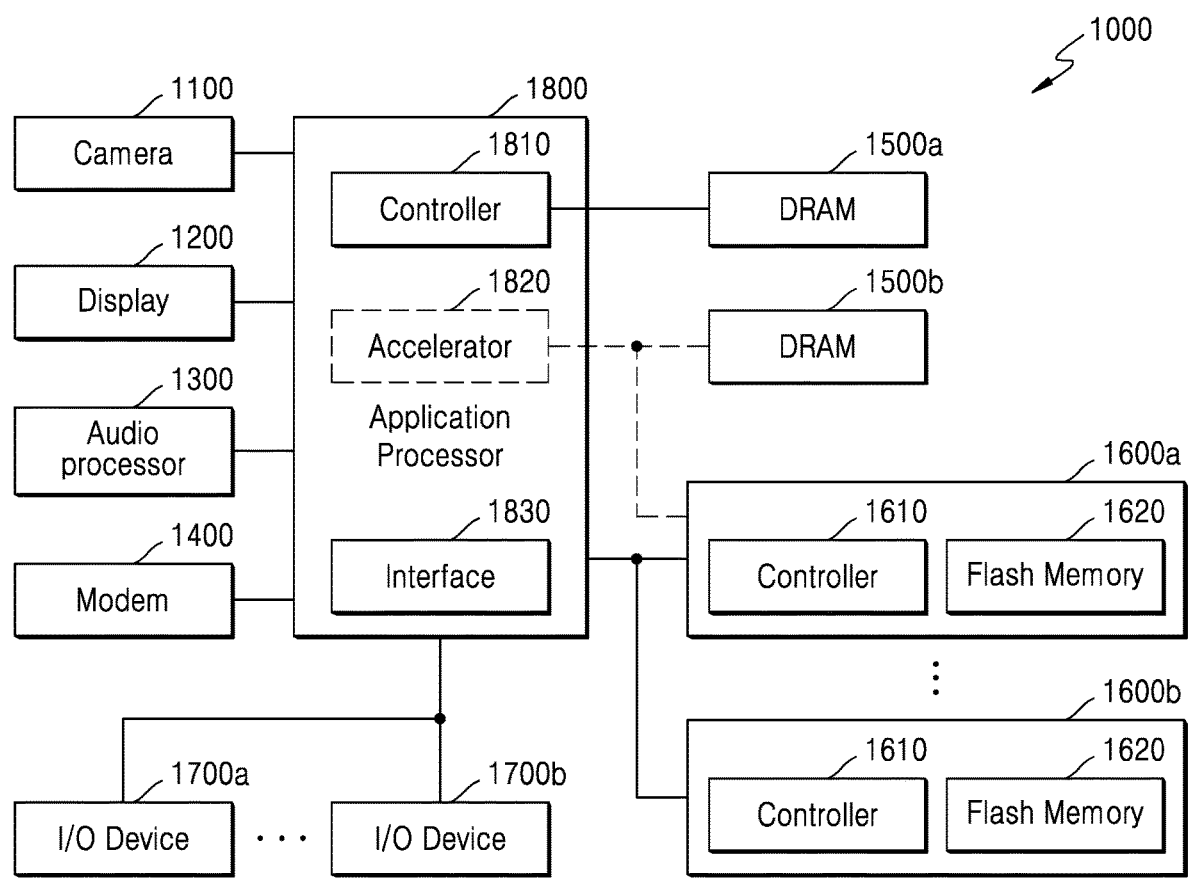
FIG. 11 is a block diagram illustrating a mobile system to which a memory device is applied according to example embodiments.

FIG. 11 is a block diagram illustrating a mobile system 1000 to which a memory device is applied according to an example embodiment.

Referring to FIG. 11, the mobile system 1000 may include a camera 1100, a display 1200, an audio processor 1300, a modem 1400, DRAMs 1500a and 1500b, flash memories 1600a and 1600b, input and output devices 1700a and 1700b, and an application processor (AP) 1800. The mobile system 1000 may be implemented by a laptop computer, a mobile phone, a smartphone, a tablet personal computer (PC), a wearable device, a healthcare device, or an Internet of things (IoT) device. In addition, the mobile system 1000 may be implemented by a server or a PC.

The camera 1100 may capture a still image or a moving image in accordance with control of a user. Usability of the camera 1100 is increasing day by day such that a smartphone application of recognizing the image captured by the camera 1100 and informing related information, of converting an image into a text and storing content of the text, or of providing a text or an audio translation from a foreign language image is released.

The display 1200 may be implemented by a liquid crystal display (LCD), an organic light emitting diode (OLED) display, an active-matrix organic light emitting diode (AM-OLED) display, or a plasma display panel (PDP) display. In another embodiment, the display 1200 has a function of a touch screen and may be used as an input device of the mobile system 1000.

The audio processor 1300 may process audio data included in the flash memories 1600a and 1600b or content of a network. For example, the audio processor 1300 may code/decode the audio data, may amplify the audio data, and may filter noise of the audio data.

The modem 1400 modulates a signal in order to transmit and receive wired/wireless data and transmits the modulated signal and demodulates the transmitted signal in order to recover the transmitted signal to an original signal on a receiving side. The input and output devices 1700a and 1700b may include devices providing digital input and/or output functions such as a universal serial bus (USB) or a storage, a digital camera, a secure digital (SD) card, a digital versatile disc (DVD), a network adapter, and a touch screen.

The AP 1800 controls an overall operation of the mobile system 1000. Specifically, the AP 1800 may control the display 1200 so that parts of content stored in the flash memories 1600a and 1600b are displayed on the display 1200. In addition, when a user input is received through the input and output devices 1700a and 1700b, the AP 1800 may perform a control operation corresponding to the user input.

The AP 1800 may be provided as a system-on-chip (SoC) driving an application program or an operating system (OS). In addition, semiconductor parts different from the AP 1800, for example, the DRAM 1500a, flash memory 1620, and/or a memory controller 1610 may be mounted by using various types of packages. That is, the DRAM 1500a, the flash memory 1620, and/or the memory controller 1610 may be mounted by using packages such as a package on package (PoP), ball grid arrays (BGA), a chip scale package (CSP), a system in package (SIP), a multichip package (MCP), a wafer-level fabricated package (WFP), and a wafer-level processed stack package (WSP). A device driver for controlling an input and output scheduler and the flash memories 1600a and 1600b may be included in a kernel of an OS driven by the AP 1800. The device driver may control access performance of the flash memories 1600a and 1600b with reference to the number of synchronous queues managed by the input and output scheduler or may control a CPU mode and a dynamic voltage and frequency scaling (DVFS) level in the SoC.

In an embodiment, the AP 1800 may include an accelerator block that is a dedicated circuit for an artificial intelligence (AI) data operation or an accelerator chip 1820 in addition to the AP 1800. Therefore, the DRAM 1500b may be additionally mounted in the accelerator block or the accelerator chip 1820. An accelerator as a functional block professionally performing a specific function of the AP 1800 may include a graphics processing unit (GPU) that is a functional block professionally processing graphic data, a neural processing unit (NPU) that is a block professionally performing AI calculation and inference, and a data processing unit (DPU) that is a block professionally transmitting data.

In an embodiment, the mobile system 1000 may include a plurality of DRAMs 1500a and 1500b. In an embodiment, a controller 1810 may be mounted in the AP 1800 so that the DRAM 1500a may be directly connected to the AP 1800. The AP 1800 may control the DRAMs 1500a and 1500b through a command and mode register setting (MRS) suitable for a joint electron device engineering council (JEDEC) standard specification or may perform communications by setting a DRAM interface code in order to use company-specific features such as a low voltage/a high speed/reliability and cyclic redundancy check (CRC)/error correction code (ECC) functions. For example, the AP 1800 may communicate with the DRAM 1500a by an interface suitable for the JEDEC standard specification such as LPDDR4 or LPDDR5 and the accelerator block or the accelerator chip 1820 may perform communications by setting a new DRAM interface code in order to control the DRAM 1500b for the accelerator with a bandwidth higher than that of the DRAM 1500a.

In FIG. 11, only the DRAMs 1500a and 1500b are illustrated. However, embodiments are not limited thereto and, if a bandwidth, a reaction speed, and a voltage condition of the AP 1800 or the accelerator chip 1820 are satisfied, any memory such as phase-change RAM (PRAM), static RAM (SRAM), magnetic RAM (MRAM), resistive RAM (RRAM), ferroelectric RAM (FRAM), or hybrid RAM may be used. The DRAMs 1500a and 1500b have latencies and bandwidths less than those of the input and output devices 1700a and 1700b or the flash memories 1600a and 1600b. The DRAMs 1500a and 1500b are initialized a power on point in time of the mobile system 1000 and have the OS and application data loaded thereon so that the DRAMs 1500a and 1500b may be used as temporary storages of the OS and the application data or execution spaces of various software codes.

In the DRAMs 1500a and 1500b, arithmetic operations of addition/subtraction/multiplication/division, vector operation, address operation, or fast Fourier transform (FFT) operation may be performed. In addition, in the DRAMs 1500a and 1500b, a function used for inference may be performed. Here, the inference may be performed by a deep learning algorithm using an artificial neural network. The deep learning algorithm may include a training step of learning a model through various data items and an inference step of recognizing data by the learned model. For example, the function used for the inference may include a hyperbolic tangent function, a sigmoid function, or a rectified linear unit (ReLU) function.

In an embodiment, the image captured by the user through the camera 1100 is signal processed and is stored in the DRAM 1500b and the accelerator block or the accelerator chip 1820 may perform AI data operation of recognizing data by using the data stored in the DRAM 1500b and the function used for the inference.

In an embodiment, the mobile system 1000 may include a plurality of storages or a plurality of flash memories 1600a and 1600b with capacities greater than those of the DRAMs 1500a and 1500b.

In an embodiment, the accelerator block or the accelerator chip 1820 may perform the training step and the AI data operation by using the flash memories 1600a and 1600b. In an embodiment, the flash memories 1600a and 1600b may efficiently perform the training step and the inference AI data operation performed by the AP 1800 and/or the accelerator chip 1820 by using an operation device included in the memory controller 1610.

In another embodiment, the AP 1800 may include an interface 1830 so that the flash memories 1600a and 1600b may be directly connected to the AP 1800. For example, the AP 1800 may be implemented by the SoC, the flash memory 1600a may be implemented by an additional chip, and the AP 1800 and the flash memory 1600a may be assembled by one package. However, embodiments are not limited thereto and the plurality of flash memories 1600a and 1600b may be electrically connected to the mobile system 1000 through connection.

The flash memories 1600a and 1600b may store the image captured by the camera 1100 or data received from a data network. For example, augmented reality/virtual reality, high definition (HD), or ultra-high definition (UHD) content may be stored.

For example, the DRAMs 1500a and 1500b may correspond to the memory device 200 illustrated in FIG. 1. The DRAMs 1500a and 1500b may include a memory cell array including a plurality of memory cells connected to a plurality of word lines, a row address decoder generating a plurality of main word line driving signals and a plurality of sub word line driving signals based on a row address, when an odd signal representing that a main word line driving signal driving an odd word line is activated among the plurality of main word line driving signals is activated, generating a plurality of encoded sub word line driving signals used for driving a target word line among the plurality of word lines by outputting the plurality of sub word line driving signals in a first order, and, when an even signal representing that a main word line driving signal driving an even word line is activated among the plurality of main word line driving signals is activated, generating the plurality of encoded sub word line driving signals by outputting the plurality of sub word line driving signals in a second order, and a word line driving circuit driving the target word line at a first voltage level or a second voltage level based on the plurality of main word line driving signals and the plurality of encoded sub word line driving signals.

While embodiments have been particularly shown and described, it will be understood that various changes in form and details may be made therein without departing from the spirit and scope of the following claims.

What is claimed is:
1. A memory device comprising:
 a memory cell array including a plurality of memory cells connected to a plurality of word lines;
 a row address decoder configured to:
  generate a plurality of main word line driving signals and a plurality of sub word line driving signals based on a row address,
  based on an odd signal representing that a first main word line driving signal driving an odd word line is activated among the plurality of main word line driving signals being activated, generate a plurality of encoded sub word line driving signals for driving a target word line among the plurality of word lines by outputting the plurality of sub word line driving signals in a first order, and,
  based on an even signal representing that a second main word line driving signal driving an even word line is activated among the plurality of main word line driving signals being activated, generate the plurality of encoded sub word line driving signals by outputting the plurality of sub word line driving signals in a second order; and a word line driving circuit configured to drive the target word line at a first voltage level or a second voltage level based on the plurality of main word line driving signals and the plurality of encoded sub word line driving signals.

2. The memory device of claim 1, wherein the row address decoder comprises:

a main row address decoder configured to generate the plurality of main word line driving signals by based on a first bit among bits included in the row address; and a sub row address decoder configured to generate a plurality of sub word line signals based on a second bit among bits included in the row address.

3. The memory device of claim 2, wherein the plurality of sub word line driving signals comprise a plurality of first sub word line driving signals obtained by delaying the plurality of sub word line signals and a plurality of second sub word line driving signals obtained by inverting the plurality of sub word line signals, wherein the plurality of encoded sub word line driving signals comprise a plurality of first encoded sub word line driving signals and a plurality of second encoded sub word line driving signals, and wherein the row address decoder comprises a sub word line driving signal encoder configured to encode the plurality of first encoded sub word line driving signals based on the plurality of first sub word line driving signals and encode the plurality of second encoded sub word line driving signals based on the plurality of second sub word line driving signals.

4. The memory device of claim 3, wherein the sub word line driving signal encoder is configured to:

based on the odd signal being activated, generate the plurality of first encoded sub word line driving signals by outputting the plurality of first sub word line driving signals in the first order, and based on the even signal being activated, generate the plurality of first encoded sub word line driving signals by outputting the plurality of first sub word line driving signals in the second order.

5. The memory device of claim 4, wherein the sub word line driving signal encoder comprises:

a plurality of first AND circuits configured to commonly receive the odd signal, receive the plurality of first sub word line driving signals in the first order, and output an AND operation result on the odd signal and the plurality of first sub word line driving signals in the first order;

a plurality of second AND circuits configured to commonly receive the even signal, receive the plurality of first sub word line driving signals in the second order, and output an AND operation result on the even signal and the plurality of first sub word line driving signals in the second order;

a plurality of first NOR circuits each configured to receive one AND operation result among the plurality of first AND circuits and one AND operation result among the plurality of second AND circuits and perform a NOR operation on the received AND operation results; and a plurality of first inverters configured to perform an inverting operation on output values of the plurality of first NOR circuits.

6. The memory device of claim 4, wherein the word line driving circuit comprises:

a plurality of first sub word line drivers respectively configured to receive the plurality of first encoded sub word line driving signals in the first order, commonly receive one of the plurality of main word line driving signals, which drives the odd word line, and drive the target word line at the first voltage level or the second voltage level; and a plurality of second sub word line drivers respectively configured to receive the plurality of first encoded sub word line driving signals in the second order, commonly receive one of the plurality of main word line driving signals, which drives the even word line, and drive the target word line at the first voltage level or the second voltage level.

7. The memory device of claim 3, wherein the sub word line driving signal encoder is configured to:

based on the odd signal being activated, generate the plurality of second encoded sub word line driving signals by outputting the plurality of second sub word line driving signals in a third order, and based on the even signal being activated, generate the plurality of second encoded sub word line driving signals by outputting the plurality of second sub word line driving signals in a fourth order.

8. The memory device of claim 7, wherein the sub word line driving signal encoder comprises:

a plurality of third AND circuits configured to commonly receive the odd signal, receive the plurality of second sub word line driving signals in the third order, and output an AND operation result on the odd signal and the plurality of second sub word line driving signals in the third order;

a plurality of fourth AND circuits configured to commonly receive the even signal, receive the plurality of second sub word line driving signals in the fourth order, and output an AND operation result on the even signal and the plurality of second sub word line driving signals in the fourth order;

a plurality of second NOR circuits each configured to receive one AND operation result among the plurality of third AND circuits and one AND operation result among the plurality of fourth AND circuits and perform a NOR operation on the received AND operation results; and a plurality of second inverters configured to perform an inverting operation on output values of the plurality of second NOR circuits.

9. The memory device of claim 8, wherein the word line driving circuit comprises:

a plurality of third sub word line drivers respectively configured to receive the plurality of second encoded sub word line driving signals in the first order, commonly receive one of the plurality of main word line driving signals, which drives the odd word line, and drive the target word line at the first voltage level or the second voltage level; and a plurality of fourth sub word line drivers respectively configured to receive the plurality of second encoded sub word line driving signals in the second order, commonly receive one of the plurality of main word line driving signals, which drives the even word line, and drive the target word line at the first voltage level or the second voltage level.

10. A memory device comprising:
- a memory cell array including a plurality of memory cells connected to a plurality of word lines;
- a row address decoder configured to:
  - generate a plurality of main word line driving signals and a plurality of sub word line driving signals based on a row address, and
  - generate a plurality of encoded sub word line driving signals for driving a target word line among the plurality of word lines by outputting the plurality of sub word line driving signals in different orders in accordance with an odd even signal representing whether an odd main word line or an even main word line is activated; and
- a word line driving circuit configured to drive the target word line based on the odd even signal and the plurality of encoded sub word line driving signals.

11. The memory device of claim 10, wherein the row address decoder comprises:
- a main row address decoder configured to generate the plurality of main word line driving signals based on a first bit among bits included in the row address; and
- a sub row address decoder configured to generate a plurality of sub word line signals based on a second bit among bits included in the row address.

12. The memory device of claim 11, wherein the plurality of sub word line driving signals comprise a plurality of first sub word line driving signals obtained by delaying the plurality of sub word line signals and a plurality of second sub word line driving signals obtained by inverting the plurality of sub word line signals,
- wherein the plurality of encoded sub word line driving signals comprise a plurality of first encoded sub word line driving signals and a plurality of second encoded sub word line driving signals, and
- wherein the row address decoder comprises a sub word line driving signal encoder configured to encode the plurality of first encoded sub word line driving signals based on the plurality of first sub word line driving signals and encode the plurality of second encoded sub word line driving signals based on the plurality of second sub word line driving signals.

13. The memory device of claim 12, wherein the sub word line driving signal encoder is configured to:
- based on the odd even signal representing that the odd main word line is activated, generate the plurality of first encoded sub word line driving signals by outputting the plurality of first sub word line driving signals in a first order, and
- based on the odd even signal representing that the even main word line is activated, generate the plurality of first encoded sub word line driving signals by outputting the plurality of first sub word line driving signals in a second order.

14. The memory device of claim 13, wherein the sub word line driving signal encoder comprises:
- a plurality of first AND circuits configured to output the plurality of first sub word line driving signals in the first order based on the odd even signal representing that the odd main word line is activated;
- a plurality of second AND circuits configured to output the plurality of first sub word line driving signals in the second order based on the odd even signal representing that the even main word line is activated;
- a plurality of first NOR circuits each configured to receive a first output among the plurality of first AND circuits and a second output among the plurality of second AND circuits and perform a NOR operation on the first output and the second output; and
- a plurality of first inverters configured to perform an inverting operation on output values of the plurality of first NOR circuits.

15. The memory device of claim 13, wherein the word line driving circuit comprises:
- a plurality of first sub word line drivers respectively configured to receive the plurality of first encoded sub word line driving signals in the first order, commonly receive one of the plurality of main word line driving signals, which drive an odd word line, and drive the target word line at a first voltage level or a second voltage level; and
- a plurality of second sub word line drivers respectively configured to receive the plurality of first encoded sub word line driving signals in the second order, commonly receive one of the plurality of main word line driving signals, which drives an even word line, and drive the target word line at the first voltage level or the second voltage level.

16. The memory device of claim 12, wherein the sub word line driving signal encoder is configured to:
- based on the odd even signal representing that the odd main word line is activated, generate the plurality of second encoded sub word line driving signals by outputting the plurality of second sub word line driving signals in a third order, and
- based on the odd even signal representing that the even main word line is activated, generate the plurality of second encoded sub word line driving signals by outputting the plurality of second sub word line driving signals in a fourth order.

17. A memory device comprising:
- a memory cell array including a plurality of memory cells connected to a plurality of sub word lines connected to a plurality of main word lines;
- a main row decoder configured to generate a plurality of main word line driving signals based on a row address;
- a sub row decoder configured to generate a plurality of sub word line signals based on the row address;
- a sub word line driving signal generating circuit configured to generate a plurality of first sub word line driving signals by delaying the plurality of sub word line signals and generate a plurality of second sub word line driving signals by inverting the plurality of sub word line signals;
- a sub word line driving signal encoder configured to generate a plurality of first encoded sub word line driving signals by outputting the plurality of first sub word line driving signals in different orders or generate a plurality of second encoded sub word line driving signals by outputting the plurality of second sub word line driving signals in different orders based on whether an odd main word line or an even main word line is driven by the plurality of main word line driving signals; and
- a sub word line driving circuit configured to receive the plurality of main word line driving signals, receive the plurality of first encoded sub word line driving signals or the plurality of second encoded sub word line driving signals, and drive a target word line among the plurality of sub word lines at a first voltage level or a second voltage level.

18. The memory device of claim 17, wherein the sub word line driving signal encoder comprises:
- a plurality of first AND circuits configured to output the plurality of first sub word line driving signals in a first order based on the odd main word line being driven by the plurality of main word line driving signals;
- a plurality of second AND circuits configured to output the plurality of first sub word line driving signals in a second order based on the even main word line being driven by the plurality of main word line driving signals;
- a plurality of first NOR circuits each configured to receive a first output among the plurality of first AND circuits and a second output among the plurality of second AND circuits and perform a NOR operation on the first output and the second output; and
- a plurality of first inverters configured to perform an inverting operation on output values of the plurality of first NOR circuits.

19. The memory device of claim 17, wherein the sub word line driving signal encoder comprises:
- a plurality of third AND circuits configured to output the plurality of second sub word line driving signals in a third order based on the odd main word line being driven by the plurality of main word line driving signals;
- a plurality of fourth AND circuits configured to output the plurality of second sub word line driving signals in a fourth order based on the even main word line being driven by the plurality of main word line driving signals;
- a plurality of second NOR circuits each configured to receive a first output among the plurality of first AND circuits and a second output among the plurality of second AND circuits and perform a NOR operation on the first output and the second output; and
- a plurality of second inverters configured to perform an inverting operation on output values of the plurality of second NOR circuits.

20. The memory device of claim 17, wherein the main row decoder is configured to generate the plurality of main word line driving signals based on a first bit among bits included in the row address, and
wherein the sub row decoder is configured to generate the plurality of sub word line signals based on a second bit among bits included in the row address.

* * * * *